United States Patent [19]
Mader et al.

[11] 4,111,719
[45] Sep. 5, 1978

[54] MINIMIZATION OF MISFIT DISLOCATIONS IN SILICON BY DOUBLE IMPLANTATION OF ARSENIC AND GERMANIUM

[75] Inventors: Siegfried R. Mader, Croton-on-Hudson; Burton J. Masters, Poughkeepsie; H. Bernhard Pogge, Hopewell Junction, all of N.Y.

[73] Assignee: International Business Machines Corporation, Armonk, N.Y.

[21] Appl. No.: 748,035

[22] Filed: Dec. 6, 1976

[51] Int. Cl.$^2$ .................. H01L 21/265; H01L 9/10
[52] U.S. Cl. ........................................ 148/1.5; 357/91
[58] Field of Search .................. 357/91, 60; 148/1.5

[56] References Cited

U.S. PATENT DOCUMENTS

| | | | |
|---|---|---|---|
| 3,485,684 | 12/1969 | Mann et al. | 148/187 |
| 3,836,999 | 9/1974 | Nishizawa | 357/63 |

OTHER PUBLICATIONS

N. Yoshihiro et al., "High Dose P-Ge Double Impln. in Silicon", Ion-Impln. in Semiconductors, (S. Namba), Plenum Press, 1974.

T. H. Yeh et al., "Strain Compensation in Si by Diff. Impurities", J. Electrochem. Soc. 116, (1969) 73.
L. Eriksson et al., "Impln. . . . Group III & V, Dopants in Si . . . , Jour. Appl. Phys. 40, (1969) 842.
L. Eriksson et al., ". . . Lattice Locations . . . Dopants in Si and Ge", Appl. Phys. Lett. 14, (1969) 195.

*Primary Examiner*—L. Dewayne Rutledge
*Assistant Examiner*—Upendra Roy
*Attorney, Agent, or Firm*—J. B. Kraft

[57] ABSTRACT

A method for forming N conductivity-type regions in a silicon substrate comprising ion implanting arsenic to form a region in said substrate having an arsenic atom concentration of at least $1 \times 10^{-2}$ As atoms/total atoms in substrate, and ion implanting germanium into said substrate region. Even though the atomic radius of arsenic is very close to that of silicon — the arsenic radius is only 0.5% smaller — when high arsenic atom concentrations of at least $1 \times 10^{-2}$ atoms/total atoms in the substrate are introduced in the substrate, and such high concentrations are only possible when arsenic is ion implanted, then atomic misfit dislocations will occur. The implanted germanium atoms compensate for the lattice strain in the silicon to minimize dislocations.

3 Claims, 6 Drawing Figures

ION IMPLANT ARSENIC

ION IMPLANT GERMANIUM

CHEMICAL VAPOR DEPOSITION

ANNEAL AT 1000° C

MISFIT DISLOCATION DENSITY, $4 \times 10^4 cm^{-1}$; 10,000X

MISFIT DISLOCATION DENSITY, $10^3 cm^{-1}$; 10,000X

MINIMIZATION OF MISFIT DISLOCATIONS IN SILICON BY DOUBLE IMPLANTATION OF ARSENIC AND GERMANIUM

BACKGROUND OF INVENTION

It has been long recognized in the prior art that when conductivity-determining impurities such as phosphorus or boron which have atom radii substantially smaller than that of silicon are introduced into a silicon substrate, misfit dislocations in the silicon will occur which interfere with the eventual performance of the integrated circuit being fabricated. The article, "Strain Compensation in Silicon by Diffused Impurities", T. H. Yeh et al, *J. Electrochem. Soc: Solid State Science*, Jan. 1969, pp. 73 - 77, which deals with the introduction of impurities by thermal diffusion sets forth that when diffusing boron or phosphorus atoms which have tetrahedral covalent radii or atomic radii which differ considerably from that of silicon, such atoms represent misfits in the silicon crystal lattice structure, and such misfits create strains which result in misfit dislocations. J. R. Carruthers et al, in "X-Ray Investigation of the Perfection of Silicon", *Journal of Applied Physics*, Vol. 34, No. 11, November 1963, pp. 3389 - 3393, define such a misfit ratio $\Gamma = r_i/r_{Si}$ where $r_i$ is the tetrahedral covalent radius of the impurity atom and $r_{Si}$ is the atomic radius of silicon. Phosphorus has a misfit ratio of 0.932 while boron has an even more severe misfit ratio of 0.746. However, they indicate that arsenic, As, has a misfit ratio $\Gamma$ approaching 1.000. Because this ratio constitutes a near perfect fit, As will not be expected to generate any strains when introduced into silicon, Ibid, pp. 3392 - 3393.

The art has further recognized as indicated by Yeh et al, that dislocations in silicon caused by either the diffused boron or phosphorus misfits may be compensated for through the introduction into the diffused silicon substrate regions of inert or nonconductivity-determining ions such as tin or germanium. In view of the disclosure in the Carruthers et al article that both boron and phosphorus have atomic radii substantially smaller than that of silicon, the above Yeh et al article goes on to teach that the tin or germanium atoms which have atomic radii larger than that of silicon provide misfits in the opposite sense to that of the phosphorus or boron dopants and, thus, balance the crystal lattice structure, and thereby minimize lattice strains and the resulting misfit dislocations.

With the progress of the art toward the use of ion implantation for the introduction of conductivity-determining impurities into silicon structures, N. Yoshihiro et al, *Ion Implantation in Semiconductors, Proceedings of the 4th International Conference on Ion Implantation*, edited by S. Namba, Plenum Press, 1975, pp. 571 - 576, recognized that the same misfit dislocation problem would occur in the formation of substrate regions by the introduction of the phosphorus atoms into the silicon by ion implantation. Yoshihiro et al, further found that the misfit problem created by the ion implantation of phosphorus could, likewise, be solved by the implantation of the germanium along with the phosphorus in a double ion implantation step.

Thus, while the prior art recognized that the introduction of germanium minimized misfit dislocation problems resulting from either boron or phosphorus misfits in silicon, it has not suggested any reason or advantage for the introduction of germanium into regions doped with arsenic impurities in silicon substrates. This was apparently due to the understanding in the art as set forth in Carruthers et al since arsenic has an atomic radius very close to that of silicon and thus a misfit ratio approaching one indicating an absence of misfits, it would serve no known purpose to incorporate germanium into an arsenic-doped silicon.

SUMMARY OF THE INVENTION

Accordingly, we have surprisingly found that with high concentration levels of arsenic atoms which may now be introduced into a silicon substrate by ion implantation, dislocations occur in the silicon which affect the operation of the integrated circuits, particularly those with the high device density of the present and future large-scale integrated circuits. It appears that even though the atomic radius of arsenic approaches that of silicon and the prior art regarded any possible variations in such radii as negligible with respect to misfit dislocations, we have found when arsenic is introduced into a silicon substrate by ion implantation at concentration exceeding $1 \times 10^{-2}$ As atoms/total atoms in the substrate, an additional implant of germanium will substantially reduce dislocations in the arsenic-doped silicon region.

The foregoing and other objects, features and advantages of the invention will be apparent from the following more particular description of the preferred embodiments of the invention, as illustrated in the accompanying drawings.

DESCRIPTION OF THE PREFERRRED EMBODIMENTS

Figure 1:
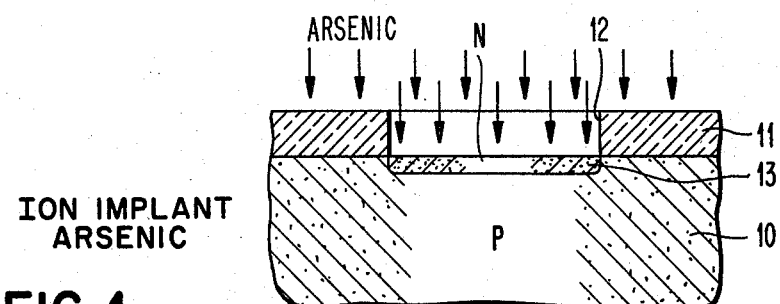
FIGS. 1 - 4 are diagrammatic partial sections of a portion of an integrated circuit at various fabrication stages in order to illustrate the practice of preferred embodiment of the present invention.

With reference to FIGS. 1 - 4, there will now be described an embodiment of the present invention wherein an N region which may be an emitter or a subcollector in a bipolar device or integrated circuit is formed in accordance with the ion implantation method of the present invention. In FIG. 1, starting with a suitable silicon wafer substrate 10 which may, for purposes of illustration, be a P-type substrate having a resistivity in the order of from 8.5 - 20 ohm-cm, the substrate is first masked by an insulative layer 11 having a thickness in the order of from 1000 A - 2000 A. For the purpose of the present embodiment, layer 11 may be silicon dioxide formed by conventional thermal oxidation techniques. It may, of course, be formed of other conventional electrically insulative material such as silicon nitride or aluminum oxide or silicon oxynitride, by chemical vapor deposition or sputter deposition. Likewise, the silicon dioxide may also be deposited by such conventional deposition techniques.

After the formation of layer 11, an opening 12 is formed in layer 11 by conventional photolithographic masking and etching techniques utilizing integrated circuit fabrication. Still with reference to FIG. 1, N-type region 13 is then formed by the introduction of arsenic ions, $^{75}$As$^+$. The introduction is accomplished using conventional ion implantation equipment and techniques as described, for example, in U.S. Pat. No. 3,756,862. The ion beam is directed at the substrate at a dosage level of $2 \times 10^{16}$ ions/cm$^2$ while the equipment is operating at a voltage level of 80 keV. The implantation is carried out at an energy level sufficient to penetrate to a depth in the order of 0.1 microns into the substrate.

Figure 2:
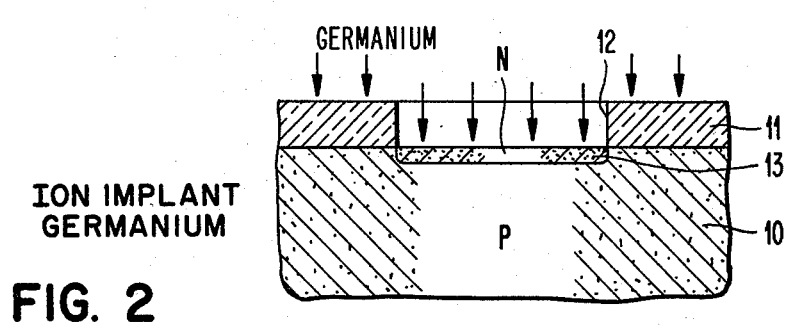

Next, FIG. 2, still utilizing standard ion implantation techniques as described above, germanium ions $^{74}$Ge$^+$ are implanted into an arsenic-doped N region 13 at a dosage level of $2 \times 10^{15}$ ions/cm$^2$ at a voltage level of 75 keV.

Figure 3:
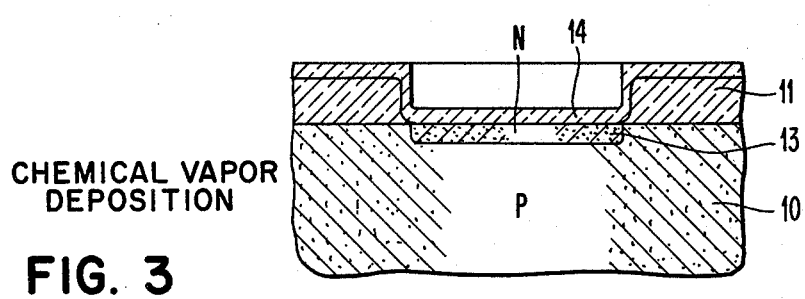

Next, FIG. 3, a thin layer of silicon dioxide 14 having a thickness in the order of 300 A - 500 A is formed in opening 12 by depositing conventional chemical vapor deposition.

Figure 4:
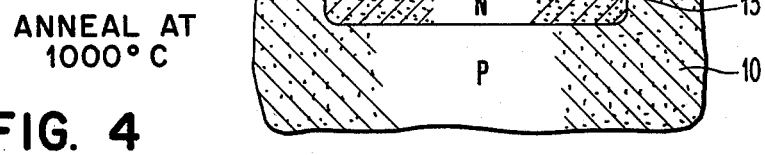

Then, FIG. 4, the structure is subjected to an anneal cycle at a temperature in the order of 1000° C for a period of time in the order of one hour in a nitrogen atmosphere during which time, N region 13 is driven into the substrate.

If the germanium implant step (FIG. 2) is eliminated from the method described above, the ion implanted arsenic regions such as region 13 which as a result of ion implantation have a relatively high arsenic concentration in the order of $1 \times 10^{-2}$ arsenic atoms/total atoms in the substrate will display a significant quantity of dislocations similar in characteristics to misfit dislocations. But, if the germanium implant step is included as described above, such dislocation faults will be minimized.

Transmission electron micrographs are prepared of the structure formed by the method of FIGS. 1 - 4 including the germanium implantation step and of the structure formed by the method of FIGS. 1 and 3 and 4 wherein the germanium implantation step is eliminated. The samples are prepared by etching from the backside, i.e., the side opposite to the implanted surface with an etchant for silicon such as a solution of one part of hydrofluoric acid and nine parts of nitric acid to remove silicon until a transparent layer about 2000 A to 3000 A remains in the implanted regions. The transmission electron micrographs are made using a Philips EM301 through the implant surfaces.

Figure 5:
FIG. 5 is a transmission electron micrograph of the surface of a silicon region implanted with arsenic only.

FIG. 5 is the micrograph of the silicon implanted with only arsenic. The quantity of dislocations is apparent.

Figure 5A:
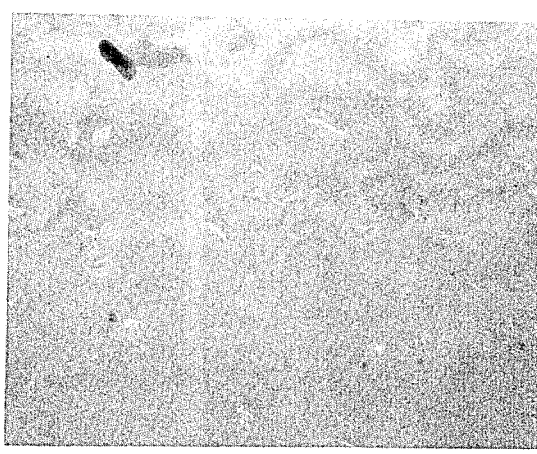
FIG. 5A is a transmission electron micrograph of the surface of a silicon region implanted with arsenic and germanium.

FIG. 5A is the micrograph of the silicon implanted with arsenic and germanium. Dislocations are minimized.

While the invention has been particularly shown and described with reference to the preferred embodiments thereof, it will be understood by those skilled in the art that various changes in form and details may be made therein without departing from the spirit and scope of the invention.

What is claimed is:

1. A method for forming N conductivity-type regions in a silicon substrate comprising
    ion implanting arsenic to form a region in said substrate having an arsenic atom concentration of at least $1 \times 10^{-2}$ As atoms/total atoms in substrate, and
    ion implanting germanium into said substrate region.

2. The method of claim 1 wherein the implanted germanium atom concentration is in the order of 0.1 times the arsenic concentration.

3. The method of claim 1 wherein said substrate is an epitaxial layer of silicon.

* * * * *